(12) United States Patent
Talledo

(10) Patent No.: US 11,610,851 B2
(45) Date of Patent: Mar. 21, 2023

(54) DIE EMBEDDED IN SUBSTRATE WITH STRESS BUFFER

(71) Applicant: STMICROELECTRONICS, INC., Calamba (PH)

(72) Inventor: Jefferson Sismundo Talledo, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 0 days.

(21) Appl. No.: 17/221,374

(22) Filed: Apr. 2, 2021

(65) Prior Publication Data

US 2021/0343658 A1 Nov. 4, 2021

Related U.S. Application Data

(60) Provisional application No. 63/017,486, filed on Apr. 29, 2020.

(51) Int. Cl.
| | |
|---|---|
| *H01L 23/538* | (2006.01) |
| *H01L 23/00* | (2006.01) |
| *H01L 21/48* | (2006.01) |
| *H01L 21/683* | (2006.01) |

(52) U.S. Cl.
CPC ........ *H01L 23/562* (2013.01); *H01L 21/4853* (2013.01); *H01L 21/4857* (2013.01); *H01L 21/6835* (2013.01); *H01L 23/5383* (2013.01); *H01L 23/5386* (2013.01); *H01L 23/5389* (2013.01); *H01L 24/19* (2013.01);
(Continued)

(58) Field of Classification Search
CPC ............... H01L 23/562; H01L 21/4853; H01L 21/4857; H01L 21/6835; H01L 23/5383; H01L 23/5386; H01L 23/5389; H01L 24/19; H01L 24/20; H01L 2221/68372; H01L 2224/214; H01L 2924/351; H01L 21/568; H01L 2224/04105; H01L 2224/24227; H01L 2224/32225; H01L 2224/73267; H01L 23/145; H01L 2224/92244; H01L 23/49816
See application file for complete search history.

(56) References Cited

U.S. PATENT DOCUMENTS

| | | |
|---|---|---|
| 8,664,656 B1 | 3/2014 | Arnold et al. |
| 9,735,128 B2 | 8/2017 | Karpman |
| 9,899,330 B2 | 2/2018 | Dalal et al. |

(Continued)

*Primary Examiner* — Selim U Ahmed
*Assistant Examiner* — Evan G Clinton
(74) *Attorney, Agent, or Firm* — Seed IP Law Group LLP

(57) ABSTRACT

The present disclosure is directed to a package, such as a wafer level chip scale package (WLCSP) or a package containing a semiconductor die, with a die embedded within a substrate that is surrounded by an elastomer. The package includes nonconductive layers on surfaces of the substrate and the elastomer as well as conductive layers and conductive vias that extend through these layers to form electrical connections in the package. The package includes surfaces of the conductive material, which may be referred to as contacts. These surfaces of the conductive material are exposed on both sides of the package and allow the package to be mounted within an electronic device and have other electronic components coupled to the package, or allow the package to be included in a stacked configuration of semiconductor dice or packages.

20 Claims, 10 Drawing Sheets

(52) U.S. Cl.
CPC .... *H01L 24/20* (2013.01); *H01L 2221/68372* (2013.01); *H01L 2224/214* (2013.01); *H01L 2924/351* (2013.01)

(56) References Cited

U.S. PATENT DOCUMENTS

| | | |
|---|---|---|
| 10,212,818 B2 | 2/2019 | Yu et al. |
| 2008/0116564 A1 | 5/2008 | Yang et al. |
| 2018/0033711 A1* | 2/2018 | Hartung ............... H01L 23/3735 |
| 2018/0096940 A1* | 4/2018 | Kim ........................ H01L 23/16 |
| 2018/0138127 A1* | 5/2018 | Lee ........................ H01L 23/562 |
| 2020/0144143 A1* | 5/2020 | Chen ..................... H01L 21/561 |

* cited by examiner

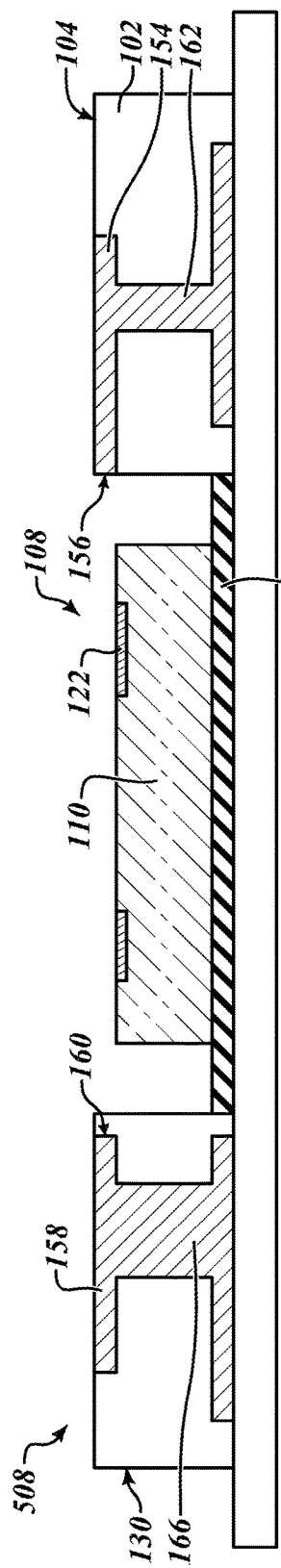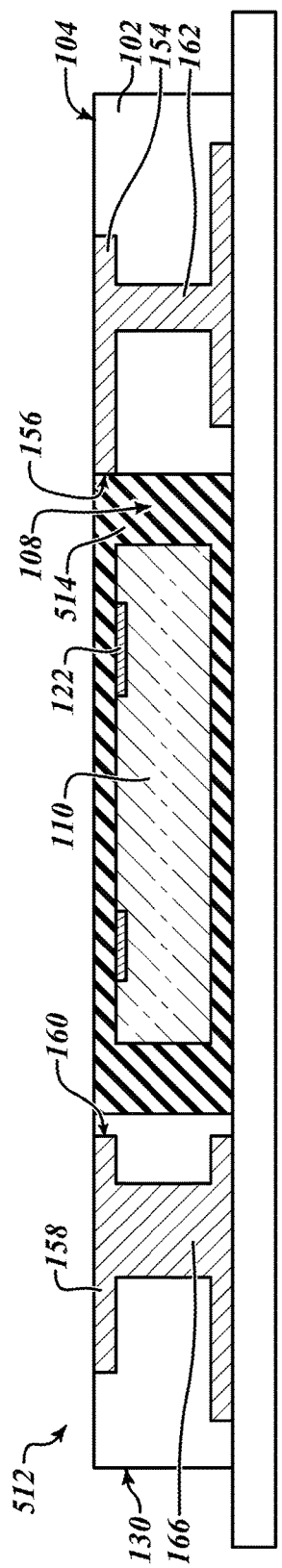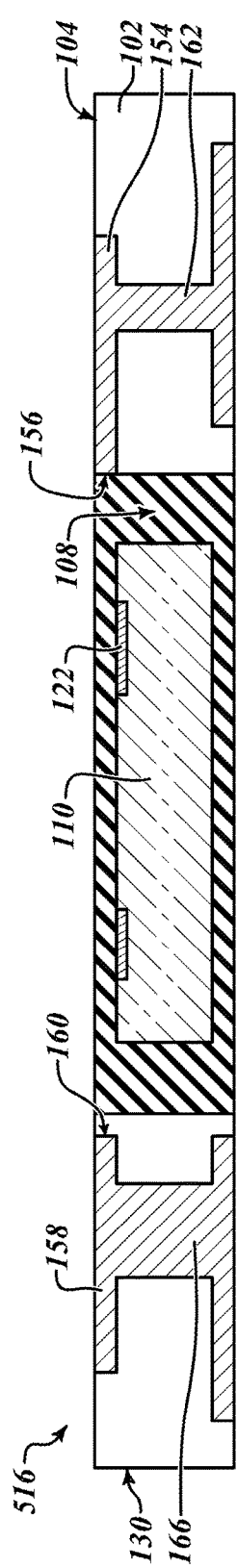

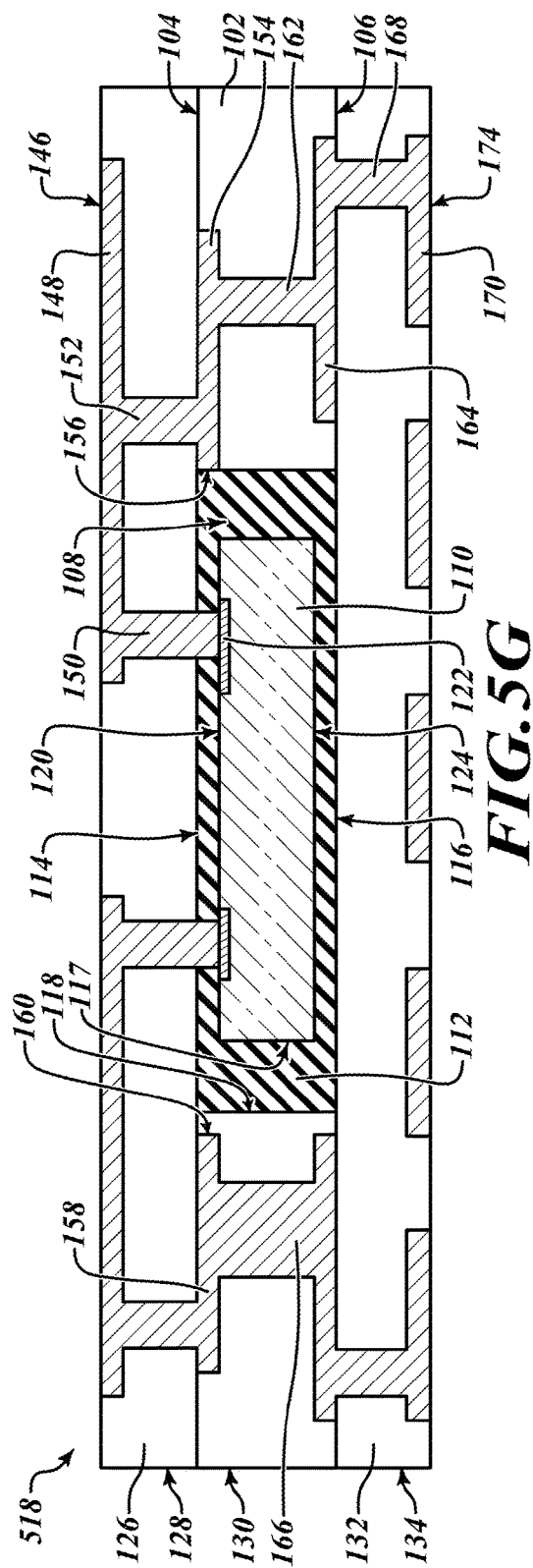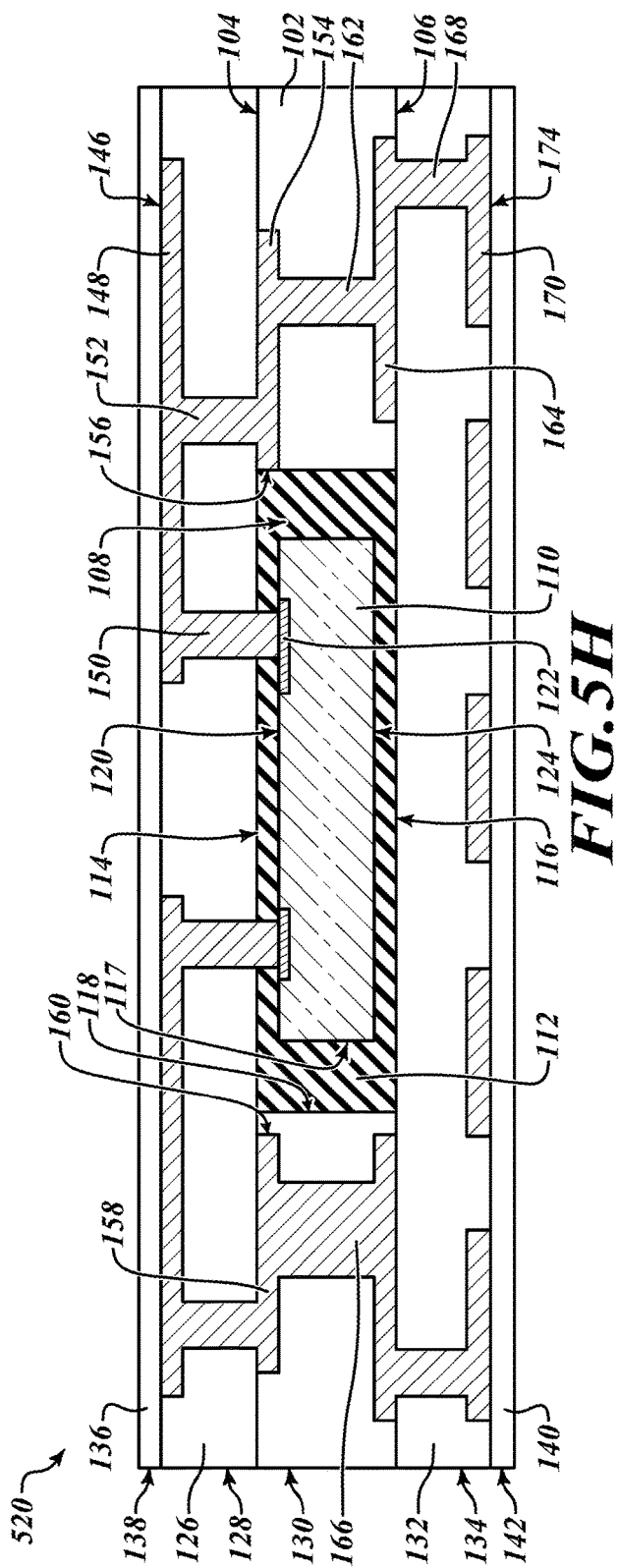

DIE EMBEDDED IN SUBSTRATE WITH STRESS BUFFER

BACKGROUND

Technical Field

The present disclosure is directed to a die embedded within a substrate and a method of manufacturing the same.

Description of the Related Art

Generally, semiconductor device packages, such as chip scale packages, wafer level chip scale packages (WLCSPs), or other conventional semiconductor packages, have a die coupled to a surface of a substrate. The die may be an integrated circuit, a processor, an application specific integrated circuit, or a sensor that is configured to detect any number of quantities or qualities of an external environment outside the semiconductor packages or within the semiconductor packages.

Stacking die on top of substrates, such as printed circuit boards results in relatively bulky packages. As demand increases for smaller packages, packages with more complex functionality, and cost-effective manufacturing, manufacturers have to balance resistance to external stresses that can cause device failure.

BRIEF SUMMARY

Embodiments of the present disclosure overcome significant challenges associated with semiconductor packages, such as increasing robustness of semiconductor packages by reducing the likelihood of failure in a die within the semiconductor packages. One significant challenge is to increase robustness of the semiconductor package against dropping. For example, when the semiconductor package is dropped electrical components within the semiconductor package such as the die or electrical connections may crack or break resulting in the semiconductor package failing.

The present disclosure is directed to a package that includes a rigid substrate with a die positioned within an opening in the substrate. A flexible dielectric material surrounds the die in the opening and holds the die in place within the opening in the substrate. The dielectric material provides a cushion or other resiliency to minimize damage in the event of a drop or other action that would otherwise damage the die or the electrical connections between the die and the substrate.

In one embodiment of the present disclosure, a semiconductor package includes a die and an elastomer within an opening in a substrate. There is a first nonconductive layer on a first surface of the substrate and the elastomer, a second nonconductive layer on a second surface of the substrate and the elastomer. There is a third nonconductive layer on the first nonconductive layer, and a fourth nonconductive layer on the second nonconductive layer. Electrical connections extend as conductive layers and vias through the elastomer, the substrate, and the first and second nonconductive layers to contact pads. Openings are in the third non-conductive layer and the fourth non-conductive layer to expose the conductive layers, which are the contact pads of the package. The elastomer or flexible dielectric surrounds the die in the opening of the substrate and the elastomer acts as a stress buffer that protects the die when the semiconductor package is dropped or exposed to external stresses and forces. The elastomer protects the die because the elastomer, which is an elastic material, can compress, flex, and expand in response to external stresses and forces applied to the semiconductor package. Similarly, the elastomer protects the die from failure due to thermal expansion because the elastomer is able to bend and flex when the semiconductor package and layers of the semiconductor package expand and compress due to changes in temperature. Accordingly, it is beneficial for the elastomer to surround the die within the opening of the substrate.

Yet another significant challenge is reducing a thickness of a semiconductor package while maintaining the package's function. For example, as electronic devices become thinner and more articulable (e.g., foldable displays or devices, bendable displays or devices, etc.) and interactive (e.g., touch screens, haptic feedback, etc.) the space to provide semiconductor die within the electronic devices can significantly reduce. Having the semiconductor package be thin enough and small enough so the semiconductor package can be incorporated into the small space available within an electronic device to provide the functionality and information for the electronic device to function optimally.

In the present disclosure, the die being within an opening of the substrate and being surrounded by the elastomer within the substrate reduces an overall thickness of the semiconductor package. The elastomer and the die have a thickness that is substantially the same as the substrate. Accordingly, the semiconductor package will be thinner than other conventional semiconductor packages that have a die that is coupled to a surface of a substrate and encased in a molding compound or covered by a cap instead of a die embedded within the substrate.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify similar elements or acts unless the context indicates otherwise. The sizes and relative portions of the elements in the drawings are not necessarily drawn to scale. For example, some of these elements may be enlarged and positioned to improve drawing legibility.

FIGS. 5A-5J are cross-sectional views of a method of manufacturing the embodiment of the package, such as the package shown in FIG. 1A.

DETAILED DESCRIPTION

Figure 1A:
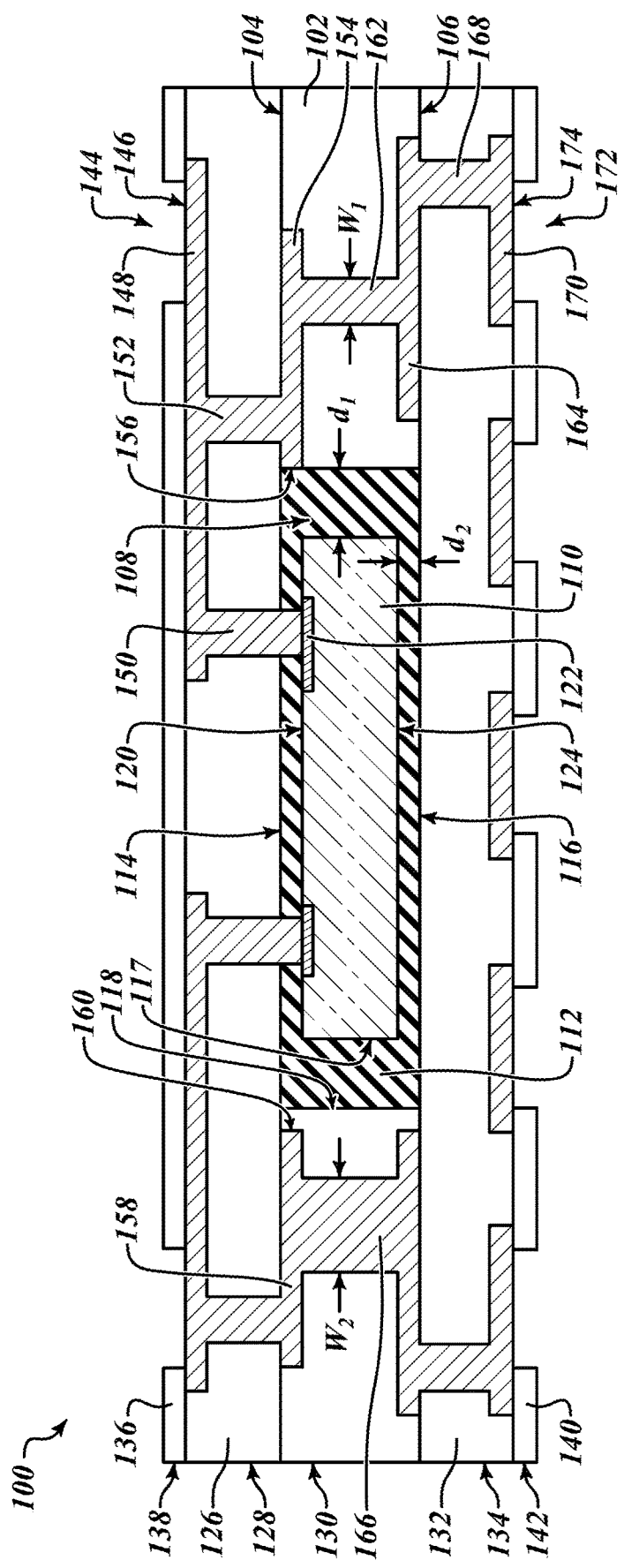
FIG. 1A is a cross-sectional view of one embodiment of a package taken along line 1A-1A in FIG. 1B.

In the following description, certain specific details are set forth in order to provide a thorough understanding of various embodiments of the disclosure. However, one skilled in the art will understand that the disclosure may be practiced without these specific details. In other instances, well-known structures associated with electronic components and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The term "left," "right," "top," and "bottom" are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences when a package is manufactured in the real world, as nothing can be made perfectly equal or perfectly the same. In other words, substantially means that there may be some slight variation in actual practice and instead is made within accepted tolerances.

As used in this specification and the appended claims, the singular forms "a," "an," and "the" include plural referents unless the content clearly dictates otherwise.

The present disclosure is directed to various embodiments of packages that each include a die embedded within a substrate. The die embedded within the substrate is positioned within an opening in the substrate. An elastomer is also within the opening and surrounds the die. The elastomer acts as a stress buffer to protect the die from external stresses such as those caused by dropping, thermal expansion, bending, flexure, and any other external stresses that the package may be exposed. In some embodiments, the substrate may have multiple openings and multiple die within the multiple openings that are surrounded by the elastomer. In yet some other embodiments, multiple die may be present within one opening and surrounded by the elastomer.

While various embodiments are shown and described with respect to packages that contain die, it will be readily appreciated that embodiments of the present disclosure are not limited thereto. In various embodiments, the structures, devices, methods, and the like described herein may be embodied in or otherwise utilized in any suitable type or form of packages, and may be manufactured utilizing any suitable type or form of packaging technologies as desired.

FIG. 1A is a cross-sectional view of an embodiment of a package 100. The package 100 includes a substrate 102. The substrate 102 includes a first surface 104 and a second surface 106 opposite to the first surface 104. The substrate 102 includes an opening 108 that has been filled with a die 110 and an elastomer 112. The opening 108 extends through the substrate 102 and extends from the first surface 104 of the substrate 102 to the second surface 106 of the substrate 102. The opening 108 may be a cavity, a hole, a recess, a trench, or some other opening that extends through or is in the substrate 102.

The elastomer 112 surrounds the die 110 and extends between the first surface 104 and the second surface 106 of the substrate 102. The elastomer 112 has a first surface 114 substantially flush with the first surface 104 of the substrate 102, and has a second surface 116 substantially flush with the second surface 106 of the substrate 102. The die 110 is surrounded by the elastomer 112, and sidewalls 117 of the die 110 are separated or spaced apart by the elastomer 112 from sidewalls 118 of the opening 108 in the substrate 102 by a first dimension d1, which may be any dimension as suitable for the manufacturing parameters. The elastomer 112 may be a silicone material, a die attach film (DAF) material, an elastic nonconductive material, a flexible dielectric, a rubber, a polymer with elastic properties, or some other selected elastic material or combination of elastic materials as suitable. In some embodiments, the elastomer 112 may be a multilayer elastomer made of a combination of elastic materials.

The die 110 is embedded within the elastomer 112 in the opening 108 of the substrate 102. The die 110 includes an active surface 120 having at least one contact 122 and a passive surface 124 that is opposite to the active surface 120. The at least one contact 122 couples the die 110 with an external electrical component, which may be another die, a sensor, or some other electronic component or combination of electronic components. The active surface 120 is closer to the first surface 104 of the substrate 102 then the second surface 106 of the substrate 102, and the passive surface 124 is closer to the second surface 106 of the substrate 102 than the first surface 104 of the substrate 102. The elastomer 112 is on the active surface 120 and the passive surface 124 of the die 110. In one embodiment, the die 110 is aligned with a center of the opening 108. The die 110 may be an application specific integrated circuit (ASIC), a processor, a sound sensor, a temperature sensor, a micro-electro mechanical system (MEMS) die, or some other semiconductor die or combination of sensors.

A first nonconductive layer 126 is on the first surfaces 104, 114 of the substrate 102 and the elastomer 112, respectively. A sidewall 128 of the first nonconductive layer 126 is substantially flush with a sidewall 130 of the substrate 102. The first nonconductive layer 126 may be a dielectric layer, an insulating layer, or some other nonconductive layer or combination of nonconductive layers as suitable.

A second nonconductive layer 132 is on the second surfaces 106, 116 of the substrate 102 and the elastomer 112. A sidewall 134 of the second nonconductive layer 132 is substantially flush with the sidewalls 128, 130 of the first nonconductive layer 126 and the substrate 102. The second nonconductive layer 132 may be a dielectric layer, an insulating layer, or some other nonconductive layer or combination of nonconductive layers as suitable. In one embodiment, the sidewalls of both of the first and second non-conductive layers are flush with the sidewalls of the substrate.

The second nonconductive layer 132 is separated or spaced apart from the die by the elastomer 112 by a dimension d2, which may be any dimension as suitable. Similarly, the first nonconductive layer may be separated or spaced apart from the die 110 by the elastomer 112 by the dimension d2 or by a different dimension as suitable. In this embodiment, the dimension d2 is less than the dimension d1.

A third nonconductive layer 136 is on the first nonconductive layer 126. A sidewall 138 of the third nonconductive layer 136 is substantially flush with the sidewalls 128, 130, 134 of the substrate 102, the first nonconductive layer 126, and the second nonconductive layer 132. The third nonconductive layer 136 may be a dielectric layer, an insulating layer, a solder mask layer, or some other nonconductive layer or combination of nonconductive layers as suitable. The third non-conductive layer 136 is thinner than the first non-conductive layer 126.

A fourth nonconductive layer 140 is on the second nonconductive layer 132. A sidewall 142 of the fourth nonconductive layer 140 is substantially flush with the sidewalls 128, 130, 134, 138 of the substrate 102, the first nonconductive layer 126, the second nonconductive layer 132, and the third nonconductive layer 136. The fourth nonconductive layer 140 is on an opposite side of the package 100 then the third nonconductive layer 136. The fourth nonconductive layer 140 may be a dielectric layer, an insulating layer, a solder mask layer, or some other nonconductive layer or combination of nonconductive layers as suitable. The fourth non-conductive layer 140 is thinner than the second nonconductive layer 132. The third and fourth non-conductive layers 136, 140 may be passivation layers that expose electrical contacts or contact pads. A plurality of electrical connections, layers, or vias may be interspersed between the non-conductive layers 126, 132, 136, 140, which may be similar to a redistribution layer.

At least one opening 144 is in the third nonconductive layer 136. The opening 144 exposes a surface 146 of a conductive layer 148. The conductive layer 148 is in the first nonconductive layer 126. The surface 146 may be referred to as a contact. The conductive layer 148 is coupled to a via 150 that extends from the conductive layer 148 to the contact 122 of the die 110. The via 150 extends through the first nonconductive layer 126 and the elastomer 112 to reach the contact 122. The via 150 electrically couples the contact 122 to the conductive layer 148. There may be a plurality of additional conductive layers, vias, and dielectric layers to form all electrical connections as suitable for the manufacturing parameters.

The conductive layer 148 is coupled to a via 152 that extends from the conductive layer 148 to a conductive layer 154 in the first surface 104 of the substrate 102. The conductive layer 154, which is on the right-hand side of FIG. 1A, includes an end 156 that is in contact with the elastomer 112. The end 156 is part of one of the sidewalls 118 of the substrate 102. Unlike the conductive layer 154 on the right-hand side of FIG. 1A, a conductive layer 158, which is on the left-hand side of FIG. 1A, is on the substrate 102 and has an end 160 that is spaced apart and separated from the elastomer 112 by a portion of the substrate 102.

The conductive layer 154 is coupled to a via 162 that extends through the substrate 102 to a conductive layer 164 in the second surface 106 of the substrate 102. The via electrically couples the conductive layer 154 in the first surface 104 of the substrate 102 to the conductive layer 164 on the second surface 106 of the substrate 102. The via 162, which is on the right hand side of FIG. 1A, has a first width W1. Unlike the via 162 on the right-hand side of FIG. 1A, a via 166, which is on the left-hand side of FIG. 1A, has a second width W2 that is greater than the first width W1 of the via 162.

The conductive layer 164 is coupled to a via 168 that extends through the second nonconductive layer 132 and the via 168 is coupled to a conductive layer 170. The conductive layer 170 is in the second nonconductive layer 132 and is aligned with an opening 172 in the fourth nonconductive layer 140 that exposes a surface 174 of the conductive layer 170. The surface 174 may be referred to as a contact. The surface 174 of the conductive layer 170 is exposed by the opening 172 on the side of the package 100 that is opposite to the side of the package on which the surface 146 of the conductive layer 148 is exposed by the opening 144 in the third nonconductive layer 136.

In the figures, the conductive layers are illustrated with a single hatch pattern for ease of illustration. It is understood that there will be different layers where the conductive layers are coupled together as conductive material is deposited at different times during the manufacturing process.

The conductive layers 148, 154, 158, 164, 170 and the vias 150, 152, 162, 166, 168 form electrical connections that extend from one side of the package 100 to another side of the package 100. The conductive layers 148, 154, 158, 164, 170 and the vias 150, 152, 162, 166, 168 allow electrical signals to be communicated to and from the contacts 146, 174 and the at least one contact 122 of the die 110. The conductive material of the conductive layers 148, 154, 158, 164, 170 and the vias 150, 152, 162, 166, 168 may be a copper material, a gold material, a silver material, an alloy material, or some other conductive material or combination of conductive materials as suitable.

In some embodiments of the package 100, the package 100 may be utilized like a printed circuit board (PCB) that the die 110 is embedded within. When the package 100 is used like the PCB, the substrate 102 is a core of the PCB, which may be referred to as a substrate core, and the nonconductive layers 126, 132 on the substrate 102 may be referred to as prepreg layers. The substrate 102 may be woven fiberglass materials strengthened and bonded together with a resin. The woven fiberglass materials may include a first plurality of fiberglass yarns directed in a first direction, a second plurality of fiberglass yarns directed in a second direction, or any combination of any number of fiberglass yarns as suitable that are intertwined together. The nonconductive layers 126, 132 may be the prepreg layers that are laminated. In an alternative embodiment, the PCB, the substrate 102, and the nonconductive layers 126, 132 may be made of multiple layers of woven fiberglass materials. The woven fiberglass materials of the substrate 102 and the nonconductive layers 126, 132 may have pluralities of fiberglass yarns that are oriented in a similar fashion, oriented in a different fashion, or oriented in any fashion as suitable.

For the purposes of this discussion, the woven fiberglass materials includes a first plurality of fiberglass yarns directed in a first direction and a second plurality of fiberglass yarns directed in a second direction that are intertwined by crossing over, under, or side-by-side each other. The first direction is transverse to the second direction. For example, the first direction may be perpendicular to the second direction, the first direction may be transverse to the second direction by 30°, or the first direction may be transverse to the second direction by any angle as suitable. The first plurality of fiberglass yarns and the second plurality of fiberglass yarns may have a zig zag pattern such that the first plurality of fiberglass yarns and the second plurality of fiberglass yarns pass under each other, over each other, or side-by-side each other.

The resin that bonds the woven fiberglass materials together may be a dielectric material. For example, the dielectric material may be an epoxy material, a plastic material, a molding compound material, a resin material, or some other nonconductive material or combination of nonconductive materials as suitable. The resin fills in spaces between the intertwined pluralities of fiberglass yarns such that the resin further strengthens and bonds together the pluralities of fiberglass yarns.

The conductive layers 148, 154, 158, 164, 170 and the vias 150, 152, 162, 166, 168 that form electrical connections in the PCB are positioned under, over, and side-by-side the pluralities of fiberglass yarns in the substrate 102 and the nonconductive layers 126, 132. For example, the conductive layers 148, 154, 158, 164, 170 and the vias 150, 152, 162, 166, 168 may pass through spaces and openings between the pluralities of fiberglass yarns that are intertwined within the substrate 102 and the nonconductive layers 126, 132.

Figure 1B:
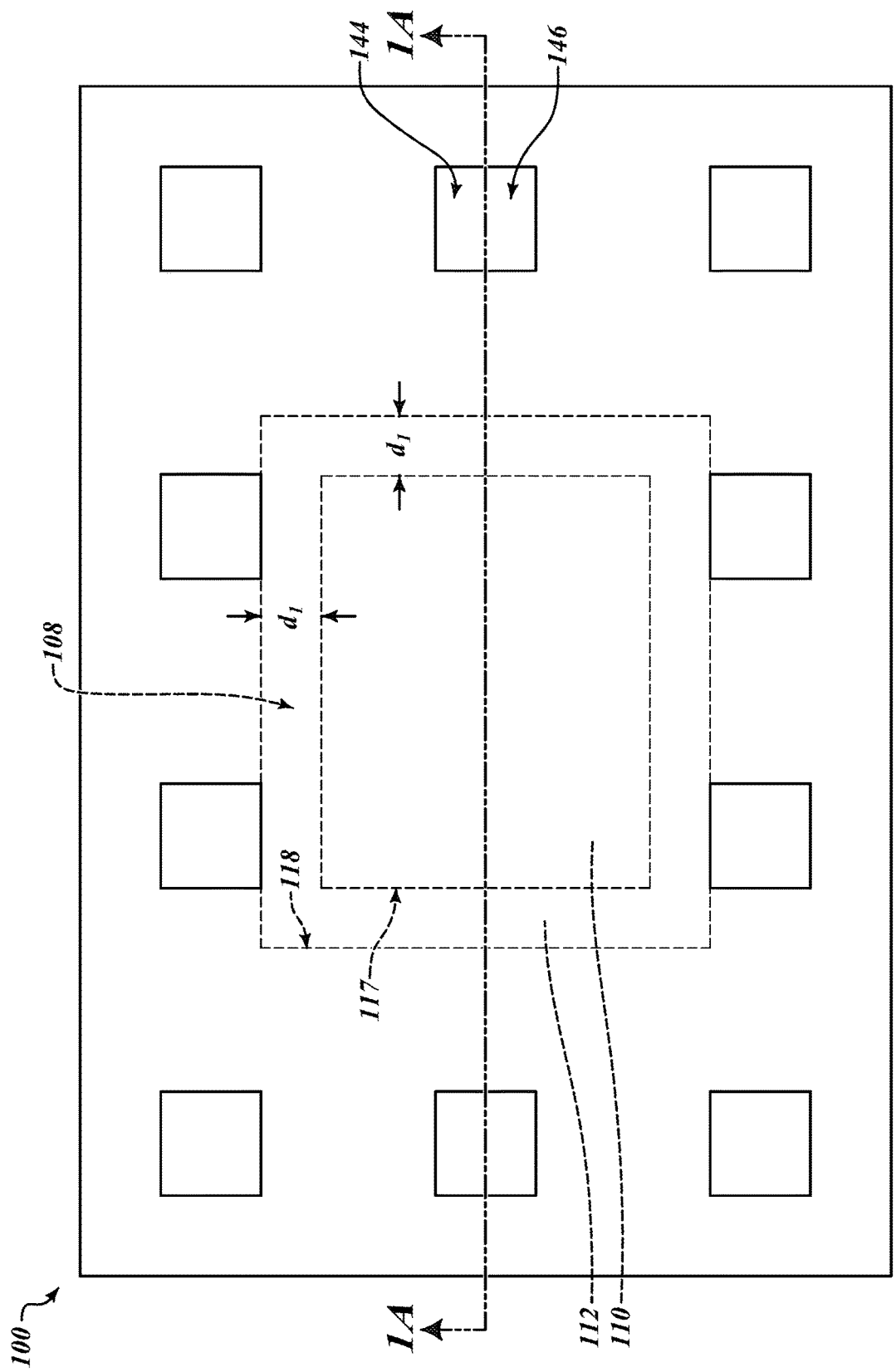
FIG. 1B is a top plan view of the embodiment of the package as shown in FIG. 1A.

FIG. 1B is a top plan view of an embodiment of the package 100. The opening 144 may be one of a plurality of openings 144 and the contact 146 may be one of a plurality of contacts 146. The openings 144 expose the contacts 146 of the package 100, which can be seen in FIG. 1B. Although the openings 144 are shown as being square in the embodiment of the package 100 in FIGS. 1A-1B, in some embodiments, the openings 144 may be rectangular, circular, triangular, or any other shape or combination of shapes as desired.

While it is not shown, the opening 172 on the opposite side of the package 100 from the side shown in FIG. 1B may be one of a plurality of openings 172, and the contact 174 on the opposite side of the package 100 exposed by the opening 172 may be one of a plurality of contacts 174 on the opposite side of the package 100. The plurality of openings 172 in the opposite side of the package 100 exposes the plurality of contacts 174 on the opposite side of the package 100. The openings 172 may be square, rectangular, circular, triangular, or any other shape or combination of shapes as desired.

In the package 100 in FIG. 1B, the pluralities of contacts 146, 174 on both sides of the package 100 surround the elastomer 112 and the die 110. In some embodiments, these pluralities of contacts 146, 174 on both sides of the package 100 may not surround the die 110 and the elastomer 112. Instead, the plurality of contacts 146, 174 may be along only two sides of the package 100, along only one side of the package 100, or along any number of sides of the package 100 as suitable.

In the package 100 in FIG. 1B, the plurality of contacts 146, 174 on both sides of the package 100 are not overlying and are not aligned with the die 110 and the elastomer 112. In some embodiments, the pluralities of contacts 146, 174 may be overlying or overlapping the die 110 and the elastomer 112. In some embodiments, the pluralities of contacts 146, 174 may be aligned with the die 110 and the elastomer 112. In some embodiments, the plurality of contacts 146, 174 on both sides of the package 100 may have the same orientation or different orientations than each other and may have different sizes than each other.

In the package 100 illustrated in FIG. 1B, these pluralities of contacts 146, 174 are square shaped. In some embodiments, the plurality of contacts 146, 174 on both sides of the package 100 may be square, circular, rectangular, or may have any other shape or combination of shapes as suitable.

The elastomer 112 is indicated by the outer dotted line that forms a boundary around the die 110. The elastomer 112 separates the sidewalls 117 of the die 110 from the sidewalls 118 of the opening 108. The elastomer 112 separates the sidewalls 117 of the die 110 from the sidewall 118 of the opening 108 by the dimension d1 along all sides of the die 110. In some embodiments, the dimension d1 separating the die 110 from the sidewalls 118 of the opening 108 may be different dimensions along the different sidewalls 117 of the die 110. The elastomer 112 forming the boundary around the die 110 acts as a stress buffer to protect the die from external stresses, which will be discussed later in greater detail of the present disclosure.

The die 110 is positioned at a center of the opening 108. In some other embodiments, the die 110 may not be at the center of the opening 108. For example, the die 110 may be separated, spaced apart, or offset from the center of the opening 108.

Figure 2:
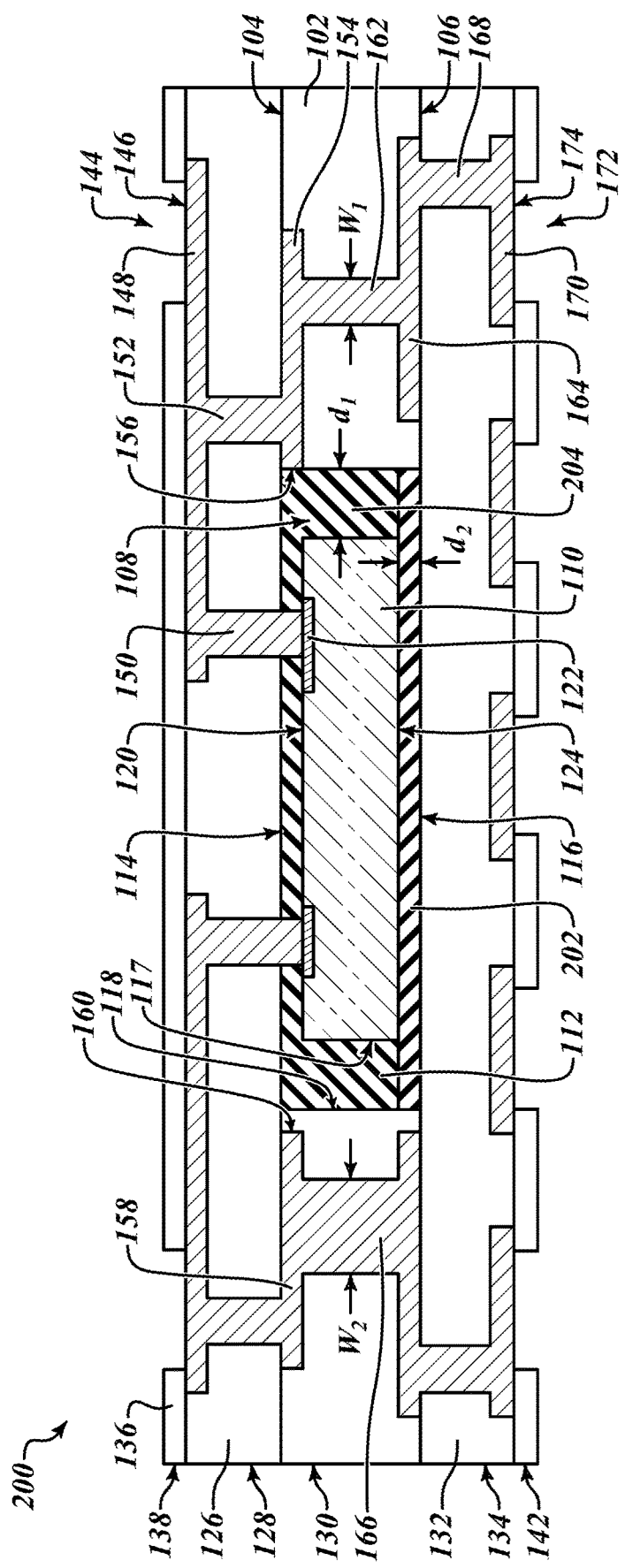
FIG. 2 is a cross-sectional view of an alternative embodiment of a package of FIG. 1B taken along line 1A-1A.
Figure 3:
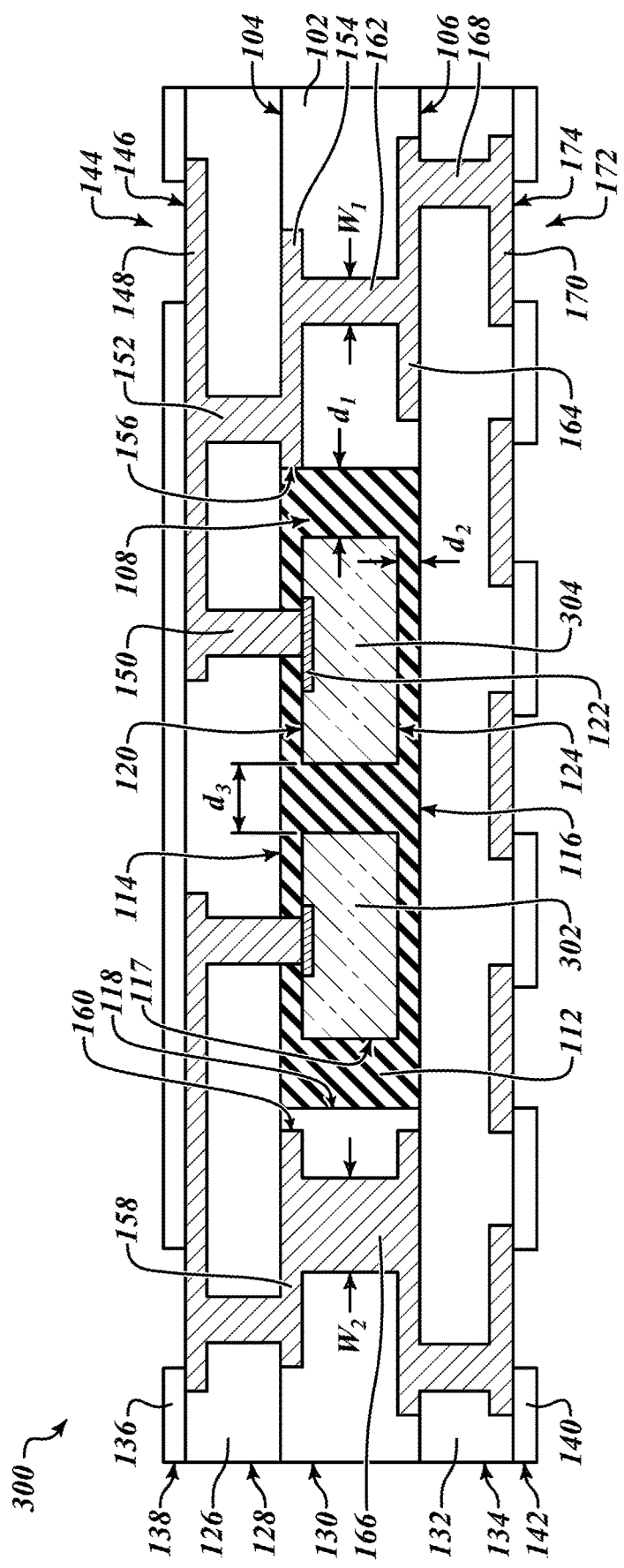
FIG. 3 is a cross-sectional view of an alternative embodiment of a package of FIG. 1B taken along line 1A-1A.
Figure 4:
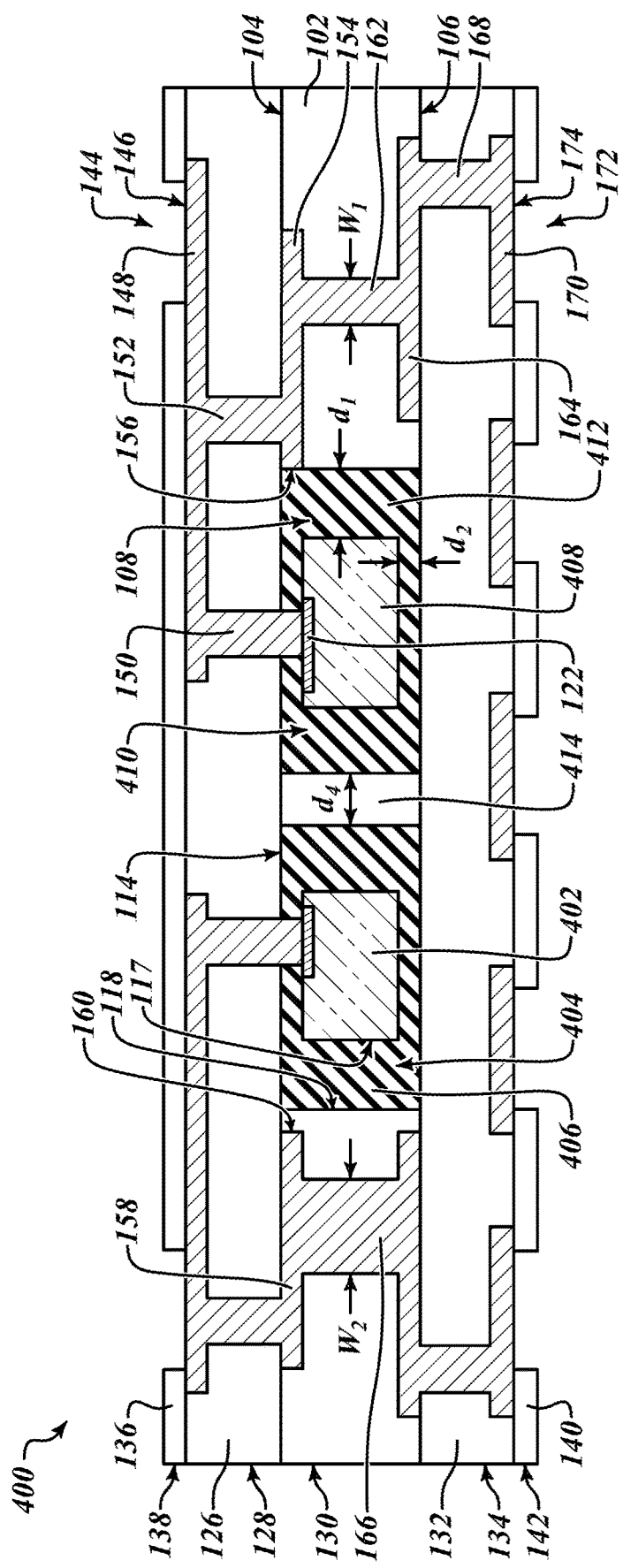
FIG. 4 is a cross-sectional view of an alternative embodiment of a package of FIG. 1B taken along line 1A-1A.

FIGS. 2, 3, and 4 are cross-sectional views of alternative embodiments of packages 200, 300, 400. These cross-sectional views of the packages 200, 300, 400 are taken along a similar line as 1A-1A as in FIG. 1B with respect to the package 100. The packages 200, 300, 400 have similar features to the embodiment of the package 100 illustrated in FIG. 1A, which are represented by the same reference numerals in FIGS. 2, 3, and 4.

FIG. 2 illustrates the package 200 including a first elastomer 202 on the second nonconductive layer 132 and on the passive surface 124 of the die 110. The first elastomer 202 couples the die 110 to the second nonconductive layer 132 and separates the passive surface 124 of the die 110 from the second nonconductive layer 132 by the second dimension d2. The first elastomer 202 extends between sidewalls 118 of the opening 108 in the substrate 102. In some embodiments, the first elastomer 202 may not extend to the sidewalls 118 of the opening 108 in the substrate 102.

A second elastomer 204 is on the active surface 120 of the die 110 and the first elastomer 202. The second elastomer 204 is between the sidewalls 118 of the opening 108 and the sidewalls 117 of the die 110, and is between the active surface 120 of the die 110 and the first nonconductive layer 126. Accordingly, the die 110, the first elastomer 202, and the second elastomer 204 fill the opening 108 in the substrate 102. The second elastomer 204 may be a different elastic material than the first elastomer 202 or may be the same elastic material as the first elastomer 202.

In some embodiments, a third elastomer may be on the active surface 120 of the die 110 and on the second elastomer 204. Accordingly, in some embodiments, any number of elastomers may be used to surround the die 110 in the opening 108 of the substrate 102 as suitable.

FIG. 3 illustrates the package 300 including a first die 302 and a second die 304 in the elastomer 112 filling the opening 108 in the substrate 102. The first die 302 and the second die 304 may have similar functionality or may have different functionality. The first die 302 and the second die 304 are separated by the elastomer 112 by a dimension d3, which may be any dimension as suitable. In some embodiments, more than two die may be present within the elastomer 112 and the opening 108. Accordingly, in some embodiments, any number of die may be present within the opening 108 of the substrate 102 and surrounded by the elastomer 112 as suitable.

FIG. 4 illustrates the package 400 including a first die 402 in a first opening 404 of the substrate 102 surrounded by a first elastomer 406, and a second die 408 in a second opening 410 of the substrate 102 surrounded by a second elastomer 412. The first die 402 and the second die 408 may have similar functionality or may have different functionality. For example, the first die 402 may be a vibrational sensor die and the second die 408 may be an ASIC die.

The first elastomer 406 is separated from the second elastomer 412 by a portion 414 of the substrate 102 having a dimension d4. The dimension d4 may be any dimension as suitable. The first elastomer 406 may be a different elastic material than the second elastomer 412 or may be the same elastic material as the second elastomer 412.

The first opening 404 may have the same dimensions or different dimensions than the second opening 410 as suitable. For example, the first opening 404 may be larger in volume than the second opening 410 because the first die 402 is larger than the second die 408 and vice versa.

In view of the discussion above with respect to the packages 100, 200, 300, 400 as illustrated in FIGS. 1A-4 some of the potential advantages of the packages 100, 200, 300, 400 over conventional semiconductor die packages are as follows.

By embedding the die 110 within the package 100 and surrounding the die 110 with the elastomer 112, the die 110 is less susceptible to failure due to external stresses. For example, if the package 100 is dropped the elastomer 112 surrounding the die 110 absorbs forces and stresses that the die 110 would be exposed to directly if the die 110 was within a conventional package and was not surrounded by the elastomer 112.

Another such example of external stresses and forces are those caused by expansion and compression due to temperature changes. For example, when the package 100 is exposed to an increase in temperature the substrate 102 and the layers 126, 132, 136, 140 expand causing the elastomer 112 to flex and bend instead of the die 110. Similarly, when the package is exposed to a decrease in temperature the substrate 102 and the layers 126, 132, 136, 140 compress causing the elastomer 112 to flex, bend, and compress instead of the die 110. The elastomer 112 flexing, bending, and compressing due to temperature changes reduces the likelihood of failure in the package 100 due to the die 110 breaking.

In view of the above discussion with respect to how the elastomer 112 protects the die 110, the package 100 is more robust and is less likely to fail due to cracking within the die 110.

Similar to protecting the die 110, the elastomer 112 also helps reduce the failure in the substrate 102 and the layers 126, 132, 136, 140 of the package 100 in a similar fashion as discussed above with respect to the die 110 embedded in the package 100.

The package 100 will be less thick than other conventional packages that contain semiconductor die by embedding the die 110 within the substrate 102 of the package 100, which again may be a PCB. For example, conventional packages with a cap over a die will be thicker than the package 100 because the cap must be spaced apart from the die.

The package 100 also allows for more complex functions to be performed because the package 100 has the surfaces 146, 174 of the conductive layers 148, 170 exposed by the openings 144, 172 on both sides of the package 100. This structure of the package 100 allows the package 100 on one side to be mounted within an electronic device and allows for electronic components (e.g., die, electrical connections, etc.) to be coupled to or stacked on the other side. This means the package 100 can be incorporated into the small space available within the electronic device to provide the information for the electronic device to function as suitable, and utilize the small space with greater efficiency than other conventional packages allowing for ever increasingly complex functions to be performed by the electronic device. For example, the electronic device may be a computer, a calculator, a phone, a tablet, a bendable or foldable electronic device, or some other electronic device or combination of electronic devices as suitable.

While these are some of the potential advantages of the packages 100, 200, 300, 400 over conventional packages, these advantages are not an exhaustive list and there may be additional advantages of the packages 100, 200, 300, 400 over conventional packages.

FIGS. 5A-5J are cross-sectional views of a method of manufacturing of the package 100 as shown in FIGS. 1A and 1B. These cross-sectional views of the method of manufacturing are taken along the line 1A-1A as in FIG. 1B with respect to the package 100. The features of the package 100 during this embodiment of the method of manufacturing are represented by the same reference numerals as in FIGS. 1A and 1B.

Figure 5A:
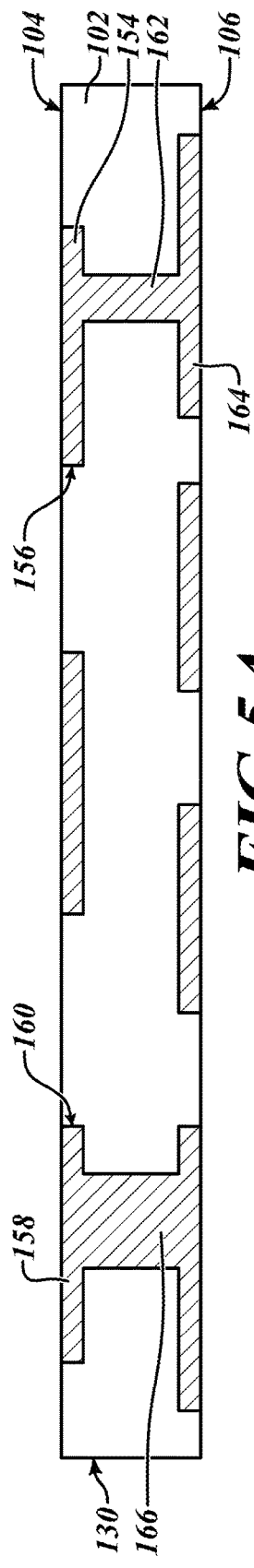

FIG. 5A is a cross-sectional view of the substrate 102 of the package 100 before the opening 108 is formed in the substrate 102. A conductive layer is on the first surface 104 of the substrate 102 and is between the ends 156, 160. Conductive layers are on the second surface 106 of the substrate 102 and are between the conductive layers 164 on the second surface 106 of the substrate 102. These conductive layers on the first surface 104 and the second surface 106 of the substrate 102 may be coupled to other conductive layers and conductive vias within the substrate 102 that may not be visible in this cross sectional view as shown in FIG. 5A.

Figure 5B:

FIG. 5B illustrates step 502 in which the opening 108 is formed in the substrate 102. The opening 108 is formed by removing a portion of the substrate 102, which may be removed by a cutting technique, an etching technique, or some other removal technique or combination of removal techniques as suitable. For example, cutting techniques may include sawing, lasering, grinding, or some other cutting technique or combination of cutting techniques as suitable; and etching techniques may include chemical etching, photolithography etching, water etching, or some other etching technique or combination of etching techniques as suitable. Forming the opening 108 may remove portions of the conductive layer on the first surface 104 of the substrate 102 between the ends 156, 160. Forming the opening 108 may remove portions of the conductive layers on the second surface 106 of the substrate 102 between the conductive layers 164 on the second surface 106 of the substrate 102.

Figure 5C:
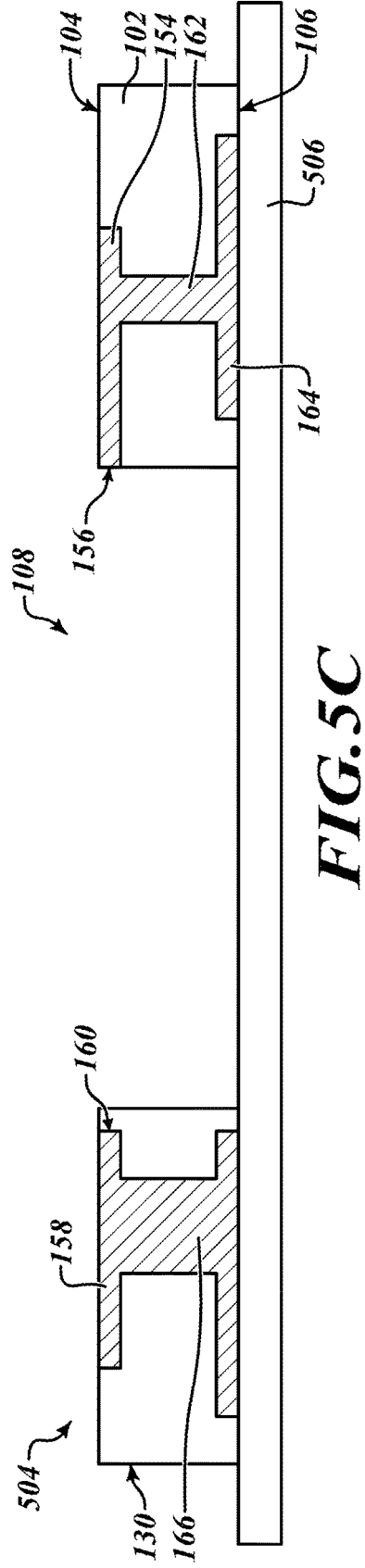

FIG. 5C illustrates step 504 in which a temporary carrier 506 is coupled to the second surface 106 of the substrate 102. The temporary carrier 506 may be a kapton tape, a dummy substrate, or some other temporary carrier or combination of temporary carriers as suitable. In some embodiments, the temporary carrier 506 may be a decomposable material. For example, the temporary carrier may be a thermally decomposable material, a water decomposable material, a chemical decomposable material, a light-sensitive decomposable material, or some other decomposable material or combination of decomposable materials as suitable.

The second surface 106 of the substrate 102 may be coupled to the temporary carrier 506 by a temporary adhesive. The temporary adhesive may be a decomposable adhesive such as a thermally decomposable adhesive, a water decomposable adhesive, a chemical decomposable adhesive, a light-sensitive decomposable adhesive, or some other temporary adhesive or combination of temporary adhesives as suitable.

FIG. 5D illustrates step 508 in which a portion 510 of the elastomer 112 is formed in the opening 108 and is coupled to the temporary carrier 506, and after, the die 110 is coupled to the portion 510 of the elastomer 112. The portion 510 of the elastomer 112 may be formed by a deposition technique such as an injection formation technique, a sputtering formation technique, or some other formation technique or combination of formation techniques as suitable.

The die 110 is coupled to the portion 510 of the elastomer 112 utilizing a pick and place technique, a flip chip technique, or may be coupled to the portion 510 of the elastomer 112 utilizing another placement technique or some combination of other placement techniques as suitable. The die 110 is placed such that a center of the die 110 is aligned with a center of the opening 108. In some embodiments, the die 110 may be positioned such that the center of the die 110 is offset from the center of the opening 108. In some embodiments, multiple die may be coupled to the portion 510 of the elastomer 112 within the opening 108, the results of which can be seen in the package 300 in FIG. 3. In some embodiments, multiple openings may be formed in the substrate 102, multiple portions of an elastomer may be formed in the multiple openings, and multiple die may be coupled to the multiple portions of the elastomer in the multiple openings, the results of which can be seen in the package 400 in FIG. 4.

FIG. 5E illustrates step 512 in which a portion 514 of the elastomer 112 is formed in the opening 108, on the active surface 120 of the die 110, and on the portion 510 of the elastomer 112 formed in step 508. The portion 514 of the elastomer 112 is formed to cover the active surface 120 of the die 110 and the sidewalls 117 of the die 110. The portion 514 of the elastomer 112 may be formed by a deposition technique such as an injection formation technique, a sputtering formation technique, or some other formation technique or combination formation techniques as suitable. In some embodiments, the portions 510, 514 of the elastomer 112 are allowed to cure within the opening 108, on the die 110, and on the temporary carrier 506. In some embodiments, the portions 510, 514 of the elastomer 112 in the openings 108 are different elastic materials, the results of which can be seen in the package 200 in FIG. 2.

FIG. 5F illustrates step 516 in which the temporary carrier 506 is removed from the second surface 106 of the substrate 102. As discussed earlier, the temporary carrier 506 may be any number of temporary carriers or temporary carrier materials. Accordingly, the temporary carrier 506 may be removed with various removal techniques depending on the composition and the type of temporary carrier 506 that is selected and was previously coupled to the second surface 106 of the substrate 102 in step 504 as illustrated and discussed with respect to FIG. 5C. For example, if the temporary carrier 506 is a dummy substrate coupled to the second surface 106 of the substrate 102 by a thermally decomposable adhesive, then the thermally decomposable adhesive is exposed to heat to decompose the thermally decomposable adhesive. By decomposing the thermally decomposable adhesive, the substrate 102 can be removed from the temporary carrier 506 by a pick and place technique or some other removal technique or combination of removal techniques as suitable.

FIG. 5G illustrates step 518 in which the nonconductive layers 126, 132 are formed on the surfaces 104, 106 of the substrate 102 and the surfaces 114, 116 of the elastomer 112. The first nonconductive layer 126 is formed on the first surfaces 104, 114 of the substrate 102 and the elastomer 112, respectively. The second nonconductive layer 132 is formed on the second surfaces 106, 116 of the substrate 102 and the elastomer 112. The nonconductive layers 126, 132 may be formed by a combination of deposition techniques, etching techniques, planarizing techniques, or any other processing techniques or combination of processing techniques as suitable. For example, deposition techniques may include vapor deposition, sputtering, laminating, injection molding, compression molding, or some other deposition techniques or combination of deposition techniques as suitable; etching techniques may include chemical etching, photolithography etching, water etching, or some other etching technique or combination of etching techniques as suitable; and planarizing techniques may include grinding, lasering, or some other planarizing technique or combination of planarizing techniques as suitable.

Forming the first non-conductive layer 126 may be completed by first depositing a nonconductive material on the first surface 104 of the substrate 102 and the first surface 114 of the elastomer 112. After the nonconductive material is deposited and formed, the nonconductive material is then planarized to form a flat and substantially uniform surface, which results in the formation of the first nonconductive layer 126. The second nonconductive layer 132 may be formed by the same above process or may be formed by a different process as suitable. In some embodiments, the nonconductive layers 126, 132 may be multiple layers of nonconductive materials, in which multiple nonconductive materials are deposited on one another and are each planarized after being deposited.

FIG. 5G, which again illustrates step 518, also illustrates the conductive layers 148, 170 and the vias 150, 152, 168 being formed in the nonconductive layers 126, 132. The vias 150, 152, 168 are formed in the nonconductive layers 126, 132 by forming openings that extend into the nonconductive layers 126, 132. The openings may be formed by drilling, etching, or some other removal technique or combination of removal techniques. At least one of these openings is formed by removing portions of the nonconductive layer 126 and the elastomer 112 so the at least one opening exposes the contact 122 of the die 110. These openings in the nonconductive layers 126, 132 are filled with a conductive material to form the vias 150, 152, 168.

FIG. 5G, which again illustrates step 518, also illustrates forming the conductive layers 148, 170, which may be formed by utilizing a masking layer, an etching technique, and a conductive material. For example, in some embodiments, a masking layer is formed on the nonconductive layer 126 and then at least one opening is formed in the masking layer to expose a surface of the nonconductive layer 126 and surfaces of the vias 150, 152. After the opening is formed, an etching is completed to remove portions of the nonconductive layer 126. A conductive material is then formed where the etching occurred to form the conductive layer 148. After the conductive layer 148 is formed, the masking layer is removed by an etching technique, a removal technique, or any technique or combinations of techniques capable of removing the masking layer as suitable. The conductive layer 170 may be formed utilizing a similar technique and process as discussed with respect to the conductive layer 148.

FIG. 5H illustrates step 520 in which the third and the fourth nonconductive layers 136, 140 are formed on the first and the second nonconductive layers 126, 132. The nonconductive layers 136, 140 may be formed utilizing similar techniques as discussed above with respect to forming the nonconductive layers 126, 132. For example, the nonconductive layers 136, 140 may be formed by a sputtering technique, an injection technique, a vapor deposition technique, or some other deposition and formation techniques or combination of deposition and formation techniques as suitable.

Figure 5I:
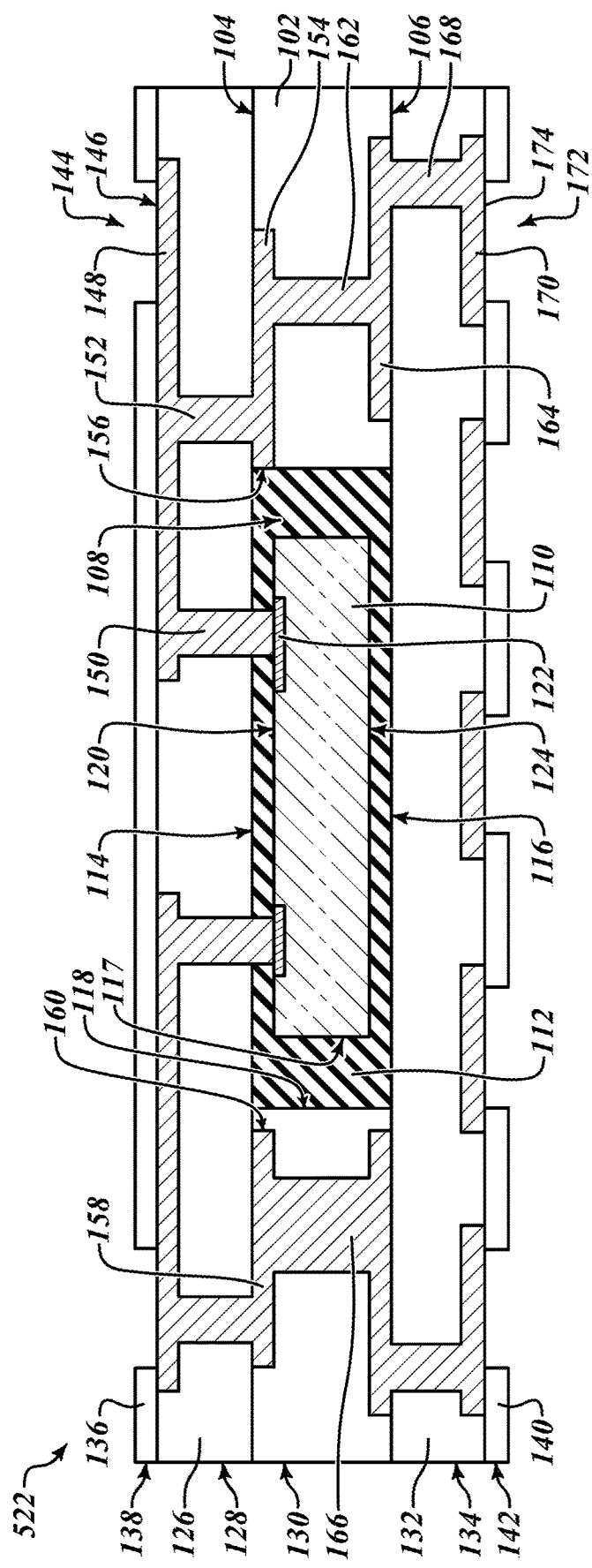

FIG. 5I illustrates step 522 in which the openings 144, 172 are formed in the third and the fourth nonconductive layers

136, 140. The openings 144, 172 may be formed by a sawing technique, an etching technique, or any other removal technique or combination of removal techniques as suitable. The openings 144, 172 are formed to expose the surfaces 146, 174 of the conductive layers 148, 172. In some embodiments, although not shown in the present disclosure, under bump metallizations (UBMs) may be formed within the openings 144, 172 and on the surfaces 146, 174 of the conductive layers 148, 172.

Figure 5J:
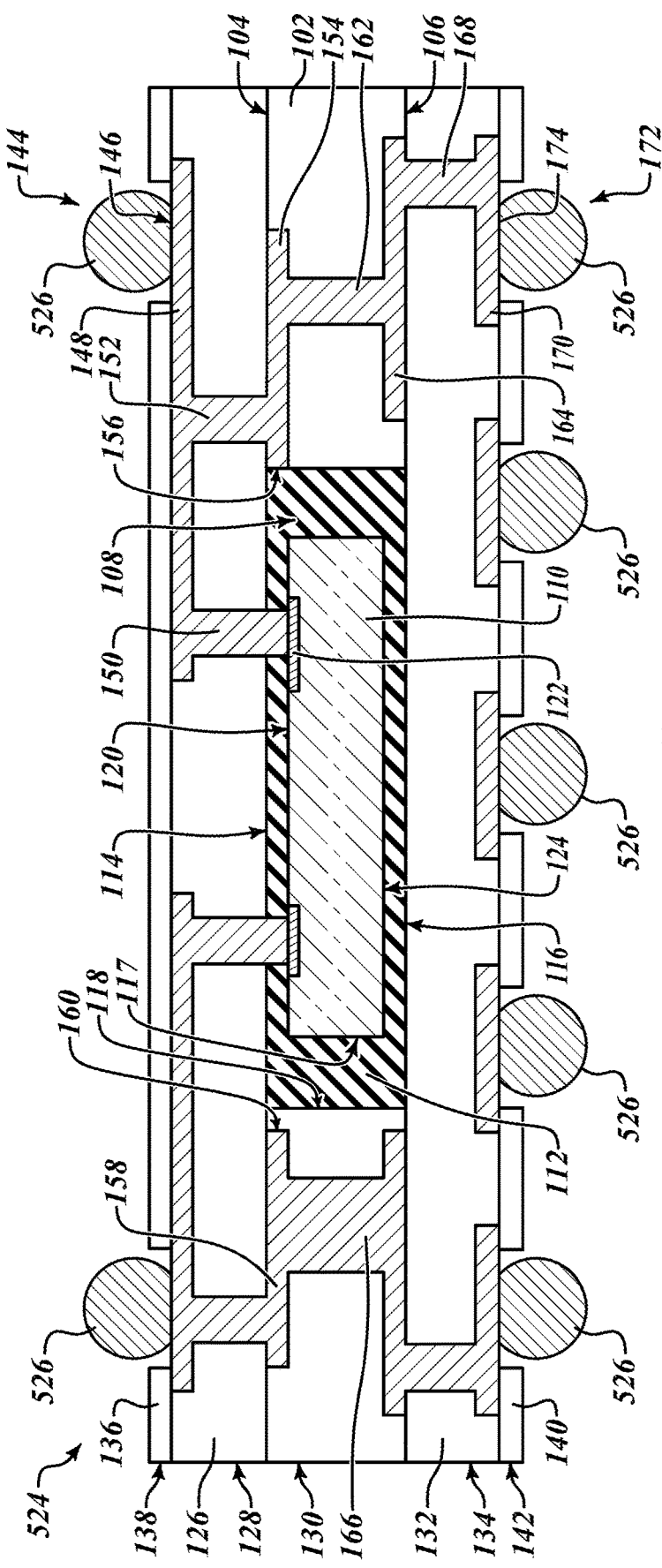

FIG. 5J illustrates step 524 in which solder balls 526 are coupled to the surfaces 146, 174 of the conductive layers 148, 170. The solder balls 526 are formed to allow the package 100 to be mounted within an electronic device and other electronic components or devices to be mounted to or stacked on the package 100. The solder balls 526 may be formed by a reflow technique or some other solder ball formation technique or combination of solder ball formation techniques as suitable.

The above steps in the method of manufacturing as illustrated in FIGS. 5A-5J may be reorganized, adapted, or altered as suitable to form the packages 100, 200, 300, 400 or any other packages that are within the scope of the present disclosure. For example, in an alternative embodiment of the method of manufacturing shown in FIGS. 5A-5J, the substrate 102 may be a wafer coupled to a temporary carrier in which an array of openings is formed with each opening being filled by at least one die and an elastomer. Once the at least one die and the elastomer are formed the temporary carrier is removed and various nonconductive layers and conductive layers are formed on both sides of the wafer utilizing similar processes as discussed in the method of manufacturing in FIGS. 5A-5J. After the nonconductive layers and conductive layers are formed, the nonconductive layers, the conductive layers, and the wafer with the dice and the elastomer within the openings of the wafer are then singulated to form packages similar to the packages 100, 200, 300, 400 disclosed in FIGS. 1A-4.

In view of the discussion above with respect to the method of manufacturing as illustrated in FIGS. 5A-5J, some of the potential advantages of the method of manufacturing over conventional methods of manufacturing semiconductor die packages are as follows.

In view of the discussion above with respect to the method of manufacturing the package 100, the likelihood of deformities or components being outside selected tolerances when compared to forming a conventional package with a cap is reduced. It is reduced because positioning a cap over a die requires high level of precision and if the cap is outside selected tolerances the conventional package may not function as suitable. In addition, because placing a cap on a conventional package takes a high level of precision, it is expensive. Accordingly, by forming the package 100 without a cap the likelihood of components being outside selected tolerances is reduced and the cost of formation is reduced as well.

While these are some of the potential advantages of the method of manufacturing as illustrated in FIGS. 5A-5J over conventional methods of manufacturing conventional packages, these advantages are not an exhaustive list and there may be additional advantages of the method of manufacturing as illustrated in FIGS. 5A-5J over conventional methods of manufacturing conventional semiconductor die packages.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate having a first surface and a second surface opposite the first surface;
   an opening extending through the substrate from the first surface to the second surface;
   a die in the opening and between the first and second surface of the substrate; and
   an elastomer in the opening and surrounding the die, the elastomer includes a third surface substantially co-planar with the first surface and a fourth surface substantially co-planar with the second surface.

2. The device of claim 1, wherein the opening includes a plurality of sidewalls, and each sidewall of the plurality of sidewalls is separated from the die by the elastomer.

3. The device of claim 1, further comprising:
   a first nonconductive layer on the first surface of the substrate and on the elastomer; and
   a second nonconductive layer on the second surface of the substrate and on the elastomer.

4. The device of claim 3, wherein the die is separated from the first non-conductive layer and the second nonconductive layer by the elastomer.

5. The device of claim 3, wherein an electrical connection coupled to the die extends through the elastomer, the first nonconductive layer, the substrate, and the second nonconductive layer.

6. The device of claim 3, wherein the elastomer includes a first portion made of a first elastic material and a second portion formed of a second elastic material that is different from the first elastic material.

7. The device of claim 6, wherein:
   the first portion is on the second nonconductive layer and is between the second non-conductive layer and the die; and
   the second portion is on the first nonconductive layer, is between the first non-conductive layer and the die, and is between a plurality of sidewalls of the die and a plurality of sidewalls of the opening.

8. The device of claim 1, wherein a first dimension of the die extending in a direction of a center axis of the opening is less than a second dimension of the opening extending in the direction.

9. The device of claim 3, wherein the elastomer is on the second non-conductive layer, is between the second non-conductive layer and the die, is on the first non-conductive layer, is between the first nonconductive layer and the die, and is between a plurality of sidewalls of the die and a plurality of sidewalls of the opening.

10. A device, comprising:
    a substrate including a first opening that extends entirely through the substrate from a first surface of the substrate to a second surface of the substrate opposite to the first surface and sidewalls of the substrate delimit the first opening;

a first die within the first opening, the first die including sidewalls; and a first elastomer in the first opening, the first elastomer encapsulates the first die and separates the sidewalls of the first die from the sidewalls of the substrate, the first elastomer includes a third surface substantially co-planar with the first surface and a fourth surface substantially coplanar with the second surface.

11. The device of claim 10, further comprising:

a first non-conductive layer on the first surface of the substrate and the first elastomer;

a second non-conductive layer on the second surface of the substrate and the first elastomer;

a third non-conductive layer is on the first non-conductive layer;

a fourth non-conductive layer is on the second non-conductive layer; and an electrical connection extends through the substrate, the first elastomer, the first non-conductive layer, and the second non-conductive layer.

12. The device of claim 11, further comprising:

a plurality of first openings in the third non-conductive layer, the plurality of first openings exposing first portions of the electrical connection; and a plurality of second openings in the fourth non-conductive layer, the plurality of second openings exposing second portions of the electrical connection.

13. The device of claim 10, further comprising a second die within the first opening, the first elastomer surrounds the second die and separates the second die from the substrate and the first die.

14. The device of claim 10, further comprising:

a second opening in the substrate, the second opening separated from the first opening;

a second die within the second opening; and a second elastomer in the second opening surrounding the second die and separating the second die from the substrate.

15. A method, comprising:

forming an opening extending through a substrate from a first surface of the substrate to a second surface of the substrate;

forming a first portion of elastic material in the opening with a third surface substantially co-planar with the first surface of the substrate;

coupling a die to the first portion of elastic material; and forming a second portion of elastic material on the die, on the first portion of elastic material, and in the opening with a fourth surface substantially co-planar with the second surface of the substrate.

16. The method of claim 15, further comprising:

coupling a temporary support to the substrate;

forming the first portion of elastic material on the temporary support; and removing the temporary support from the substrate and the first portion of elastic material.

17. The method of claim 15, further comprising:

forming a first nonconductive layer on the first surface of the substrate and on the second portion of elastic material;

forming a second nonconductive layer on the second surface of the substrate and on the first portion of elastic material; and forming an electrical connection extending through the second portion of elastic material, the first nonconductive layer, the substrate, and the second nonconductive layer.

18. The method of claim 17, further comprising:

forming a third nonconductive layer on the first nonconductive layer and a first surface of the electrical connection;

forming a fourth nonconductive layer on the second nonconductive layer and a second surface of the electrical connection;

forming a plurality of first openings in the third nonconductive layer to expose portions of the first surface of the electrical connection; and forming a plurality of second openings in the fourth nonconductive layer to expose second portions of the second surface of the electrical connection.

19. The method of claim 15, wherein forming the first portion of elastic material and forming the second portion of elastic material includes utilizing a first elastic material for the first portion and a second elastic material for the second portion, the second elastic material is different from the first elastic material.

20. The device of claim 14, wherein the second elastomer includes a fifth surface substantially co-planar with the first surface of the substrate and a sixth surface substantially co-planar with the second surface of the substrate.

* * * * *